United States Patent

Collar et al.

[11] Patent Number: 5,900,716
[45] Date of Patent: May 4, 1999

[54] BALANCED BATTERY CHARGER

[75] Inventors: Stuart Collar, Algonquin; Scott Stratmoen, Arlington; Robert J. Sutowski, Downers Grove; Michael J. Trainor, Palatine, all of Ill.

[73] Assignee: Northrop Grumman Corporation, Los Angeles, Calif.

[21] Appl. No.: 08/805,871

[22] Filed: Mar. 3, 1997

[51] Int. Cl.$^6$ .................................................. H01M 10/46
[52] U.S. Cl. ......................................................... 320/118
[58] Field of Search .................................... 320/103, 116, 320/118, 119, 121, 122, 127, 132, 136, FOR 105, FOR 107, FOR 114, FOR 116, FOR 117, FOR 129

[56] References Cited

U.S. PATENT DOCUMENTS

| | | | |
|---|---|---|---|
| 4,331,911 | 5/1982 | Park | 320/119 |
| 4,479,083 | 10/1984 | Sullivan | 320/123 |
| 4,530,044 | 7/1985 | Milner | 323/365 |
| 4,949,028 | 8/1990 | Brune | 320/116 |
| 5,063,340 | 11/1991 | Kalenowsky | 320/166 |
| 5,177,425 | 1/1993 | Goto | 320/130 |
| 5,479,083 | 12/1995 | Brainard | 320/121 |
| 5,504,415 | 4/1996 | Podrazhansky et al. | 320/118 |
| 5,592,067 | 1/1997 | Peter et al. | 320/103 |
| 5,602,481 | 2/1997 | Fukuyama | 324/434 |
| 5,617,004 | 4/1997 | Kaneko | 320/119 |
| 5,710,504 | 1/1998 | Pascual et al. | 180/658 |

FOREIGN PATENT DOCUMENTS

| | | |
|---|---|---|
| PCT/US91/06548 | 9/1991 | European Pat. Off. . |
| PCT/GB92/02147 | 11/1992 | European Pat. Off. . |
| 0 588 615 A2 | 3/1994 | European Pat. Off. . |
| PCT/US94/13969 | 12/1994 | European Pat. Off. . |
| 0 731 545 A2 | 9/1996 | European Pat. Off. . |

OTHER PUBLICATIONS

Heribert Schmidt and Christoph Siedle, "The Charge Equalizer—A New System to Extend Battery Lifetime in Photovoltaic Systems, U.P.S. and Electric Vehicles", International Telecommunications Energy Conference, Paris, Sep. 1993, vol. 2, No. Conf. 15, pp. 146–151.

"Microcontroller–Driven NICD Battery Charger", Elektor Electronics, vol. 19, No. 215, Oct. 1, 1993, pp. 30–36.

*Primary Examiner*—Edward H. Tso
*Attorney, Agent, or Firm*—Terry J. Anderson; Karl J. Hoch, Jr.

[57] ABSTRACT

A balanced battery charger maintains a balanced charge upon a plurality of battery cells which are connected in series with one another. The balanced battery changer has a monitoring circuit for determining when an imbalance between the charge upon the battery cells occurs and a charging/discharging circuit for selectively charging and discharging at least a selected one of the battery cells so as to generally balance the charge upon the battery cells. Balancing the charge upon the battery cells substantially enhances the life thereof.

17 Claims, 2 Drawing Sheets

BALANCED BATTERY CHARGER

FIELD OF THE INVENTION

The present invention relates generally to battery charging circuits and more particularly to a balanced battery charger for maintaining a balanced charge upon a plurality of battery cells which are connected in series with one another, so as to enhance the useful life thereof.

BACKGROUND OF THE INVENTION

Battery chargers for maintaining a desired charge upon one or more batteries are well known. Such battery chargers are frequently utilized to maintain a charge upon a plurality of series connected batteries by applying a voltage thereacross. The series connected batteries are thereby charged according to well known principles.

However, it is also well known that such a contemporary battery charger does not mitigate the formation of an imbalanced charge upon the series connected batteries and that such an imbalance substantially reduces the useful life of the batteries. As those skilled in the art will appreciate, such imbalances commonly occur due to inherent differences in individual cell construction, such as differences in the internal resistance of each cell.

Thus, it is beneficial to provide a battery charging circuit for charging series connected batteries which prevents the formation of an imbalance between the batteries being charged, so as to enhance the useful life thereof.

SUMMARY OF THE INVENTION

The present invention specifically addresses and alleviates the above-mentioned deficiencies associated with the prior art. More particularly, the present invention comprises a balanced battery charger for maintaining a balanced charge upon a plurality of battery cells which are connected in series with one another. The balanced battery charger more particularly comprises a monitoring circuit for determining when an imbalance between the charge upon the battery cells occurs, and a charging/discharging circuit for charging and discharging at least a selected one of the battery cells so as to generally balance the charge upon the battery cells. Balancing the charge upon the battery cells substantially enhances the life thereof.

The monitoring circuit is preferably configured to monitor a selected battery cell's charge relative to a charge of a plurality of the battery cells. According to the preferred embodiment of the present invention, the monitoring circuit is configured to monitor a selected battery cell's charge relative to the charge of all of the battery cells.

The monitoring circuit preferably comprises a voltage divider for providing a reference signal representative of a desired charge on selected battery cells and a tap for providing a battery cell charge signal representative of an actual charge on the selected battery cell (s). A comparator compares the reference signal to the cell charge signal and effects control of the charging/discharging circuit.

Thus, the monitoring circuit preferably comprises a voltage divider for providing a reference signal representative of a desired charge on selected battery cells, a tap for providing a battery cell charge signal representative of the actual charge on the selected battery cell(s), and a comparator for comparing the referenced signal to the cell charge signal and for effecting control of the charging/discharging circuit. The charging/discharging circuit preferably comprises a micro controller having a tri-state output, the tri-state output facilitating charging, discharging, and maintenance of the charge upon the selected battery cell(s).

According to the preferred embodiment of the present invention, the monitoring circuit and the charging/discharging circuit are at least partially defined by a micro controller, preferably via a multiplexed analog input and digital output of the micro controller. More particularly, the monitoring circuit and the charging/discharging circuit are at least partially defined by a PIC16C74 micro controller, with the monitoring circuit being defined by an analog input circuit and a multiplexed analog input and digital output circuit of the PIC16C74, and the charging/discharging circuit being defined by the multiplexed analog input and digital output circuit of the PIC16C74 micro controller.

Thus, according to the preferred embodiment of the present invention, the balanced battery charger comprises a charging/discharging circuit which is configured to charge at least one selected battery cell when the selected battery cell(s) have a lower charge than other battery cells, discharge at least one selected battery cell when the selected battery cell(s) have a higher charge than other battery cells, and maintain a charge upon at least one selected battery cell when the selected battery cell (s) have substantially the same charge as the other battery cells.

These, as well as other advantages of the present invention will be more apparent from the following description and drawings. It is understood that changes in the specific structure shown and described may be made within the scope of the claims without departing from the spirit of the invention.

DETAILED DESCRIPTION OF THE PREFERRED EMBODIMENT

The detailed description set forth below in connection with the appended drawings is intended as a description of the presently preferred embodiment of the invention and is not intended to represent the only form in which the present invention may be constructed or utilized. The description sets forth the functions and the sequence of steps for constructing and operating the invention in connection with the illustrated embodiment. It is to be understood, however, that the same or equivalent functions and sequences may be accomplished by different embodiments that are also intended to be encompassed within the spirit and scope of the invention.

Figure 1:
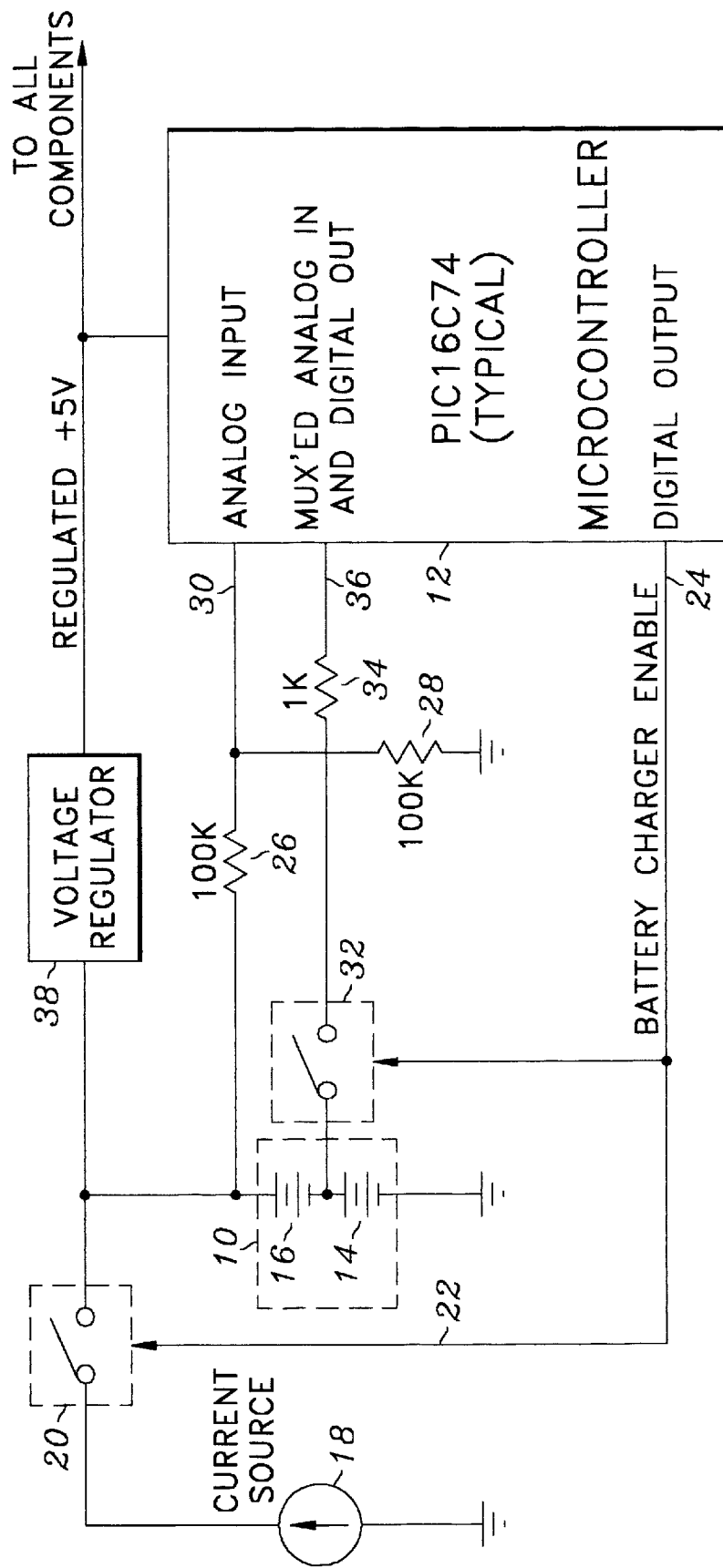
FIG. 1 is a schematic of the preferred embodiment of the present invention.

Referring now to FIG. 1, the balanced battery charger of the present invention generally comprises a plurality of battery cells 10 for which it is desired to maintain a balanced charge thereupon, and a micro controller 12 for facilitating the maintenance of a balanced charge upon the plurality of battery cells 10.

More particularly, the plurality of battery cells 10 comprise a first battery cell 14 and a second battery cell 16 for which it is desirable to maintain a generally uniform charge thereupon so as to enhance the useful life thereof. Although only two battery cells 14, 16 are described and shown in accordance with the preferred embodiment of the present invention, those skilled in the art will appreciate that various different plural numbers of such battery cells may be utilized according to the present invention. Indeed, each individual cell 14, 16 of the present invention may actually comprise a plurality of cells connected either in series or parallel or any combination thereof, as desired. Thus, the balanced battery charger of the present invention may be utilized to maintain a balanced or generally uniform charge upon either a plurality of single cells or various different configurations or groups of cells, as desired.

According to the preferred embodiment of the present invention, a current source 18 provides charging current to the plurality of battery cells 10 when first switch 20 is closed, thus completing the circuit to the plurality of battery cells 10. The first switch 20 is controlled via input 22 thereto which is communicated from digital output 24 of the micro controller 12.

The monitoring circuit generally comprises a voltage divider comprised of first 26 and second 28 resistors. The number and values of resistors in the voltage divider is dependant upon the number of battery cells, e.g., 14, 16, in the plurality of battery cells 10. As those skilled in the art will appreciate, the values of the resistors of the voltage divider must be selected such that the voltage measured intermediate two resistors thereof is representative of the desired charge upon the first battery cell 14.

The actual charge upon the first battery cell 14 is measured, through second switch 32 and current limiting resistor 34, at the multiplexed analog input and digital output 36 of the micro controller 12. The micro controller 12 then compares the actual value of the charge upon the first battery cell 14 which is received at the multiplexed analog input and digital output 36 with the desired charge for the first battery cell 14 as measured at the analog input 30 and generated by the voltage divider comprised of resistors 26 and 28. If the actual charge upon the first battery cell 14, as measured at the multiplexed analog input and digital output 36 is higher than the desired charge, as measured at the analog input 30, then multiplexed analog input and digital output 36 is set to a low state so as to function as a drain and thereby discharge the first battery cell 14. In a like manner, when the charge upon the first battery cell 14 determined to be at a lower than desired state when compared with the desired charge at the analog input 30, then the multiplexed analog input and digital output 36 is set at a high state, so as to function as a source and thereby effect charging of the first battery cell 14. When the charge upon the first battery cell 14 is determined to be within tolerance, i.e., generally the same as the charge upon the second battery cell 16 such that a balanced condition exists, then the multiplexed analog input and digital output 36 of the micro controller 12 is set at its zero level so as to effect maintenance of the charge upon the first battery cell 14, i.e., no charging or discharging of the first battery cell 14 occurs.

As those skilled in the art will appreciate, when only two battery cells 14, 16 are utilized, then the first 26 and second 28 resistors of the voltage divider will have equal values, e.g., 100 kohms, for example, so as to provide a signal representative of the desired value of the battery charge of the first battery 14 to the analog input 30 of the micro controller 12.

The battery charge enable signal is provided by the digital output 24 of the micro controller 12 so as to effect actuation or closing of the first switch 20 and the second switch 32. The first switch 20 is closed so as to enable charging of the plurality of battery cells 10. The second switch 32 is closed so as to effect charging of the first battery cell 14 or discharging of the first battery cell 14, as determined by the state of the multiplexed analog input and digital output 36 of the micro controller 12. The second switch 32 also prevents current leakage from the plurality of battery cells 10 through the microprocessor, when the microprocessor is unpowered. However, as those skilled in the art will appreciate, the second switch 32 may not be required if the microprocessor itself prevents such leakage.

Voltage regulator 38 regulates the voltage output of the plurality of battery cells 10 to a desired value, such as +5 volts, which may be utilized to effect the powering of desired electrical devices, including the micro controller 12, if desired.

Figure 2:
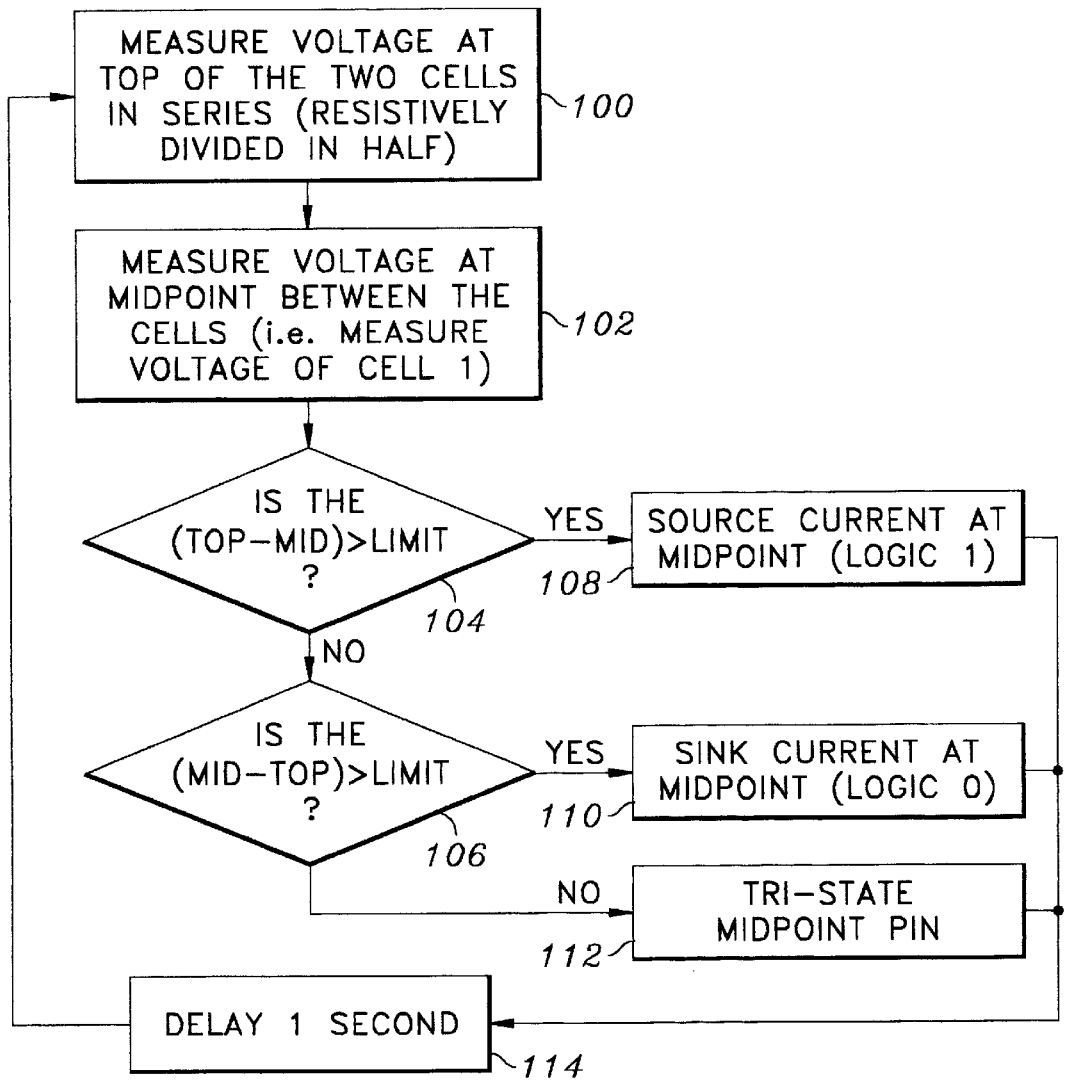
FIG. 2 is a flow chart showing the operation of the preferred embodiment of the present invention.

Referring now to FIG. 2, in operation the voltage is measured 100 at the top of the two cells in series and is resistively divided in half to determine the desired voltage for first battery cell 14. The voltage is also measured 102 at the midpoint between the cells so as to effect measurement of the actual voltage upon the first battery cell 14.

If the top measurement, i.e., the desired voltage for the first battery cell 14 as input to the analog input 30 minus the mid measurement, i.e., the actual measurement of the voltage upon the first battery cell 14 as measured at the multiplexed analog input and digital output 36, is greater than a predetermined limit 104, then the multiplexed analog input and digital output 36 is set 108 to a logic 1 so as to function as a current source to effect charging of the first battery cell 14. Otherwise, if the mid measurement minus the top measurement is greater than the preset limit, then the multiplexed analog input and digital output 36 is set 110 to logic 0 so as to function as a drain or sink so as to effect discharging of the first battery cell 14.

Otherwise, the multiplexed analog input and digital output 36 of the micro controller 12 is set 112 to the tri-state midpoint so as to effect maintenance of the charge upon the first battery cell 14, i.e., no substantial charging or discharging occurs.

According to the preferred embodiment of the present invention, the process repeats 114 after approximately a one second delay, so as to effect repeated and continual monitoring of the balance of the charge upon the plurality of battery cells 10 and so as to effect the generally constant maintenance of a desired balanced condition thereof.

Also, although the PIC16C74 micro controller 12 utilizes a multiplexed analog input and digital output 36, those skilled in the art will appreciate that various other microprocessors may be utilized which provide for analog input and digital output on separate pins thereof.

It is understood that the exemplary balanced battery charger described herein and shown in the drawings represents only a presently preferred embodiment of the invention. Indeed, various modifications and additions may be made to such embodiment without departing from the spirit and scope of the invention. For example, the limits for steps 104 and 106 of FIG. 2 may be different from one another, as desired. Also, various different types and numbers of battery cells may be utilized. Further, as those skilled in the art will appreciate, various different microprocessors may be utilized. Indeed, a custom micro controller may be utilized.

Thus, these and other modifications and additions may be obvious to those skilled in the art and may be implemented to adapt the present invention for use in a variety of different applications.

What is claimed is:

1. A balanced battery charger for maintaining a balanced charge upon a plurality of battery cells which are connected in series with one another, the balanced battery charger comprising:

a) a monitoring circuit for determining when an imbalance between the charges upon the battery cells occurs; and b) a charging/discharging circuit for selectively charging and discharging at least a selected one of the battery cells so as to generally balance the charge upon the battery cells;

c) wherein the charging/discharging is at least partially defined by a multiplexed analog input and digital output of a micro controller; and d) wherein balancing the charge upon the battery cells substantially enhances a life thereof.

2. The balanced battery charger as recited in claim 1, wherein the monitoring circuit is configured to monitor a selected battery cell's charge relative to a charge of a plurality of the battery cells.

3. The balanced battery charger as recited in claim 1, wherein the monitoring circuit monitors a selected battery cell's charge relative to a charge of all of the battery cells.

4. The balanced battery charger as recited in claim 1 wherein the charging/discharging circuit is configured to discharge at least one selected battery cell when the selected battery cell is charged higher than a desired charge.

5. The balanced battery charger as recited in claim 1, wherein the monitoring circuit and the charging/discharging circuit are at least partially defined by a micro controller.

6. The balanced battery charger as recited in claim 1, wherein the monitoring circuit and the charging/discharging circuit are at least partially defined by a micro controller, with the monitoring circuit being defined by an analog input circuit and a multiplexed analog input and digital output circuit of the micro controller, and the charging/discharging circuit being defined by a multiplexed analog input and digital output circuit of the micro controller.

7. The balanced battery charger as recited in claim 1, wherein the charging/discharging circuit is configured to:

a) charge at least one selected battery cell when the selected battery cell(s) have a lower charge than other battery cells;

b) discharge at least one selected battery cell when the selected battery cell (s) have a higher charge than other battery cells; and c) maintain a charge upon at least one selected battery cell when the selected battery cell(s) have substantially the same charge as other battery cells.

8. A method for maintaining a balanced charge upon a plurality of battery cells which are connected in series with one another, the method comprising the steps of:

a) determining when an imbalance between the charges upon the battery cells occurs; and b) selectively charging and discharging at least a selected one of the battery cells so as to generally balance the charge upon the battery cells;

c) wherein the step of selectively charging and discharging at least a selective one of the battery cells comprises selectively charging and discharging at least a selected one of the battery cells utilizing a multiplexed analog input and digital output of a micro controller; and d) wherein balancing the charge upon the battery cells substantially enhances a life thereof.

9. The method as recited in claim 8, wherein the step of determining when an imbalance between the charge upon the battery cells occurs comprises monitoring a selected battery cell's charge relative to a charge of a plurality of the battery cells.

10. The method as recited in claim 8, wherein the step of determining when an imbalance between the charge upon the battery cells occurs comprises monitoring a selected battery cell's charge relative to a charge of all of the battery cells.

11. The method as recited in claim 8, wherein the step of determining when an imbalance between the charge upon the battery cells occurs comprises the steps of:

a) providing a reference signal representative of a desired charge upon selected battery cell(s);

b) providing a cell charge signal representative of an actual charge upon the selected battery cell(s);

c) comparing the reference signal to the cell charge signal and utilizing the result to effect control of the charging/discharging circuit.

12. The method as recited in claim 8, wherein the step of determining when an imbalance between the charge upon the battery cells occurs and the step of selectively charging and discharging at least a selected one of the battery cells comprises determining when an imbalance between the charge upon the battery cells occurs and selectively charging and discharging at least a selected one of the battery cells via a micro controller.

13. The method as recited in claim 8, wherein the steps of determining when an imbalance between the charge upon the battery cells occurs and selectively charging and discharging at least a selected one of the battery cells comprise determining when an imbalance between the charge upon the battery cells occurs and selectively charging and discharging at least a selected one of the battery cells via a micro controller, wherein the monitoring circuit is at least partially defined by an analog input circuit and a multiplexed analog input and digital output circuit of the micro controller, and a charging/discharging circuit is defined by a multiplexed analog input and digital output circuit of the micro controller.

14. The method as recited in claim 8, wherein the step of selectively charging and discharging at least a selected one of the battery cells comprises the steps of:

a) charging at least one selected battery cell when the selected battery cell(s) have a lower charge than other battery cells;

b) discharging at least one selected battery cell when the selected battery cell(s) have a higher charge than other battery cells; and c) maintaining a charge upon at least one selected battery cell when the selected battery cell(s) have substantially the same charge as other battery cells.

15. A balanced battery charger for maintaining a balanced charge upon a plurality of battery cells which are connected in series with one another, the balanced battery charger comprising:

a) a monitoring circuit for determining when an imbalance between the charges upon the battery cells occurs, wherein the monitoring circuit comprises:

i) a voltage divider for providing a reference signal representative of a desired charge upon selected battery cell(s);

ii) a tap for providing a cell charge signal representative of an actual charge on the selected battery cell(s); and where iii) a comparator for comparing the reference signal to the cell charge signal and for effecting control of the charging/discharging circuit; and b) a charging/discharging circuit for selectively charging and discharging at least a selected one of the battery cells so as to generally balance the charge upon the battery cells;

c) wherein balancing the charge upon the battery cells substantially enhances a life thereof.

16. A balanced battery charger for maintaining a balanced charge upon a plurality of battery cells which are connected in series with one another, the balanced battery charger comprising:

a) a monitoring circuit for determining when an imbalance between the charges upon the battery cells occurs; and wherein the monitoring circuit comprises:
   i) a voltage divider for providing a reference signal representative of a desired charge on selected battery cells, a tap for providing a cell charge signal representative of an actual charge on the selected battery cell(s), and a comparator for comparing the reference signal to the cell charge signal and for effecting control of the charging/discharging circuit; and
   ii) the charging/discharging circuit comprises a micro controller having a tri-state output, the tri-state output facilitating charging, discharging, and maintenance of the charge upon the selected battery cell(s);
b) a charging/discharging circuit for selectively charging and discharging at least a selected one of the battery cells so as to generally balance the charge upon the battery cells; and
c) wherein balancing the charge upon the battery cells substantially enhances a life thereof.

17. A method for maintaining a balanced charge upon a plurality of battery cells which are connected in series with one another, the method comprising the steps of:

a) determining when an imbalance between the charges upon the battery cells occurs, wherein the step of determining when an imbalance between the charge upon the battery cells occurs comprises:
   i) providing a reference signal representative of a desired charge on selected battery cells via a voltage divider;
   ii) providing a cell charge signal representative of an actual charge on the selected battery cell(s) via a tap;
   iii) comparing the reference signal to the cell charge signal and then utilizing the result to effect control of the charging/discharging circuit; and
   iv) selectively charging, discharging and maintaining the charge upon the selected battery cell(s) via micro controller having a tri-state output; and
b) selectively charging and discharging at least a selected one of the battery cells so as to generally balance the charge upon the battery cells; and
c) wherein balancing the charge upon the battery cells substantially enhances a life thereof.

* * * * *